US012527193B2

(12) United States Patent
Yang et al.

(10) Patent No.: US 12,527,193 B2
(45) Date of Patent: Jan. 13, 2026

(54) DISPLAY DEVICE

(71) Applicant: Samsung Display Co., Ltd., Yongin-si (KR)

(72) Inventors: Gihoon Yang, Hwaseong-si (KR); Taemin Kim, Hwaseong-si (KR); Bongsung Seo, Suwon-si (KR); Donggeun Shin, Hwaseong-si (KR); Ho Lim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 984 days.

(21) Appl. No.: 17/558,095

(22) Filed: Dec. 21, 2021

(65) Prior Publication Data

US 2022/0302419 A1   Sep. 22, 2022

(30) Foreign Application Priority Data

Mar. 18, 2021   (KR) .................. 10-2021-0034983

(51) Int. Cl.
*H10K 59/38*   (2023.01)
*H10K 59/80*   (2023.01)

(52) U.S. Cl.
CPC .......... *H10K 59/38* (2023.02); *H10K 59/879* (2023.02); *H10K 59/8792* (2023.02); *H10K 59/8731* (2023.02)

(58) Field of Classification Search
CPC .. H10K 59/38; H10K 59/879; H10K 59/8792; H10K 59/8731
See application file for complete search history.

(56) References Cited

U.S. PATENT DOCUMENTS

| 10,916,722 | B2 | 2/2021 | Park et al. |
| 11,016,325 | B2 | 5/2021 | Kwon et al. |
| 2020/0041695 | A1* | 2/2020 | Chen ..................... C08G 77/24 |

FOREIGN PATENT DOCUMENTS

| KR | 10-2019-0111177 A | 10/2019 |
| KR | 10-2019-0136737 A | 12/2019 |
| KR | 10-2020-0006206 A | 1/2020 |
| KR | 10-2020-0032294 A | 3/2020 |
| KR | 10-2020-0039857 A | 4/2020 |

* cited by examiner

*Primary Examiner* — Joseph L Williams
(74) *Attorney, Agent, or Firm* — Womble Bond Dickinson (US) LLP

(57) ABSTRACT

A display device includes a first anti-reflective member and a second anti-reflective member. The first anti-reflective member includes a first refractive layer having a first refractive index and a second refractive layer having a second refractive index smaller than the first refractive index. The second anti-reflective member includes a third refractive layer having a third refractive index, a fourth refractive layer disposed on the third refractive layer and having a fourth refractive index equal to or smaller than the third refractive index, and a fifth refractive layer disposed between the third refractive layer and the fourth refractive layer and having a fifth refractive index greater than each of the third refractive index and the fourth refractive index. Thus, the display device has improved strength and reflectance.

20 Claims, 7 Drawing Sheets

DISPLAY DEVICE

CROSS-REFERENCE TO RELATED APPLICATION

This application claims priority to and the benefit of Korean Patent Application No. 10-2021-0034983, filed on Mar. 18, 2021, the content of which is hereby incorporated by reference in its entirety.

BACKGROUND

1. Field

The present disclosure relates to a display device. More particularly, the present disclosure relates to a display device including an anti-reflective member.

2. Description of the Related Art

Various types of display devices are being utilized to provide image information. It is desirable for an outer surface of such a display device to have high surface hardness and impact resistance to protect the display device from an external environment and to have reliability even after repeated usage.

In addition, when the display device is exposed to an external light such as various lightings and a natural light, images displayed through the display device may not be clearly seen by (or may not be clearly transmitted to) a user or the user may feel a sense of fatigue due to a reflected light. Accordingly, the display device is desirable (e.g., required) to have an anti-reflective function.

SUMMARY

An aspect according to one or more embodiments of the present disclosure is directed toward a display device including an anti-reflective member with improved reflectance and strength.

According to embodiments of the present disclosure, a display device includes a light emitting element layer, a light control layer on the light emitting element layer and including a quantum dot, a first anti-reflective member on the light control layer, a color filter layer on the first anti-reflective member and including a filter light blocking portion and a color filter portion, and a second anti-reflective member on the color filter layer. The first anti-reflective member includes a first refractive layer having a first refractive index and a second refractive layer between the first refractive layer and the color filter layer and having a second refractive index smaller than the first refractive index. The second anti-reflective member includes a third refractive layer on the color filter layer and having a third refractive index, a fourth refractive layer on the third refractive layer and having a fourth refractive index equal to or smaller than the third refractive index, and a fifth refractive layer between the third refractive layer and the fourth refractive layer and having a fifth refractive index greater than each of the third refractive index and the fourth refractive index.

The display device may include first, second, and third light emitting areas to respectively emit lights having different wavelengths from each other, and the color filter portion may overlap the first and second light emitting areas and may not overlap the third light emitting area.

The color filter portion may be a yellow filter portion.

The color filter portion may have a refractive index equal to or greater than about 1.4 and equal to or smaller than about 1.7 (e.g., about 1.40 to about 1.70).

A portion of the color filter portion, which does not overlap the filter light blocking portion, may have a thickness equal to or greater than about 100 nm and equal to or smaller than about 2600 nm (e.g., a thickness of about 100 nm to about 2600 nm).

A ratio of the first refractive index to the second refractive index may be 1.06:1.00 to 1.70:1.00.

A difference between the first refractive index and the second refractive index may be in a range equal to or greater than about 0.1 and equal to or smaller than about 0.9 (e.g., in a range of about 0.1 to about 0.9).

The first refractive index may be equal to or greater than about 1.60 and equal to or smaller than about 2.20 (e.g., may be about 1.60 to about 2.20), the second refractive index may be equal to or greater than about 1.30 and equal to or smaller than about 1.50 (e.g., may be about 1.30 to about 1.50), and a thickness of each of the first refractive layer and the second refractive layer may be equal to or greater than about 100 nm and equal to or smaller than about 400 nm (e.g., may be about 100 nm to about 400 nm).

Each of the first refractive layer and the fifth refractive layer may include silicon nitride or silicon oxynitride, each of the second refractive layer, the third refractive layer, and the fourth refractive layer may include a polymer resin including at least one repeating unit represented by any one of the following Chemical Formulae 1, 2, and 3:

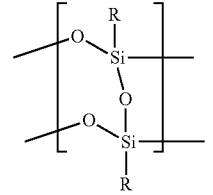

Chemical Formula 1

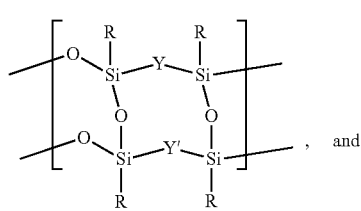

Chemical Formula 2

, and

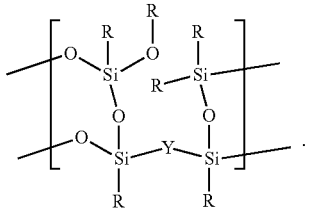

Chemical Formula 3

.

In Chemical Formulae 1 to 3, Y and Y' are each independently O, NRa, or $(SiO_{3/2}R)_{4+2n}O$, R and Ra are each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and n is an integer number of 1 to 20.

The polymer resin may further include a filler having a hollow structure, and the filler may include at least one of a hollow silica, an acrylic-based polymer, a vinyl-based polymer, and an epoxy-based polymer.

The polymer resin may include more than 0 wt % and less than 50 wt % of the filler based on a total weight of the polymer resin.

In Chemical Formulae 1 to 3, R may be an alkyl group having 1 to 10 carbon atoms and substituted with at least one fluorine atom.

A ratio of the third refractive index to the fourth refractive index may be 1.07:1.00 to 1.00:1.00, a ratio of the fourth refractive index to the fifth refractive index may be 1.00:1.20 to 1.00:1.60, and a ratio of the third refractive index to the fifth refractive index may be 1.00:1.20 to 1.00:1.60.

A difference between the third refractive index and the fourth refractive index may be equal to or greater than about 0 and equal to or smaller than about 0.11 (e.g., may be about 0 to about 0.11), and each of a difference between the fourth refractive index and the fifth refractive index and a difference between the third refractive index and the fifth refractive index may be equal to or greater than about 0.51 and equal to or smaller than about 0.70 (e.g., may be about 0.51 to about 0.70).

Each of the third refractive index and the fourth refractive index may be equal to or greater than about 1.39 and equal to or smaller than about 1.50 (e.g., may be about 1.39 to about 1.50), the fifth refractive index may be equal to or greater than about 1.9 and equal to or smaller than about 2.2 (e.g., may be about 1.90 to about 2.20), each of a thickness of the third refractive layer and a thickness of the fifth refractive layer may be equal to or greater than about 100 nm and equal to or smaller than about 400 nm (e.g., may be about 100 nm to about 400 nm), and a thickness of the fourth refractive layer may be equal to or greater than about 75 nm and equal to or smaller than about 85 nm (e.g., may be about 75 nm to about 85 nm).

The display device may include first, second, and third light emitting areas to respectively emit lights having different wavelengths from each other, and the first refractive layer may include a first portion that does not overlap the third light emitting area and having the first refractive index and a second portion that overlaps the third light emitting area and having a refractive index smaller than the first refractive index.

The first portion may include silicon nitride, and the second portion may include silicon oxynitride.

The third refractive layer may have an opening defined therethrough to overlap the third light emitting area, and the second refractive layer may fill in the opening.

The second anti-reflective member may further include a sixth refractive layer between the third refractive layer and the fifth refractive layer and having a sixth refractive index greater than the third refractive index and smaller than the fifth refractive index.

The sixth refractive index may be equal to or greater than about 1.6 and equal to or smaller than about 1.8 (e.g., may be about 1.60 to about 1.80), and the sixth refractive layer may have a thickness equal to or greater than about 100 nm and equal to or smaller than about 400 nm (e.g., may be about 100 nm to about 400 nm).

According to embodiments of the present disclosure, a display device includes a light emitting element layer to emit a blue light, a light control layer including a first light control portion to convert the blue light to a red light, a second light control portion to convert the blue light to a green light, and a third light control portion to transmit the blue light, a first anti-reflective member on the light control layer, a color filter layer on the first anti-reflective member and including a filter light blocking portion and a color filter portion, and a second anti-reflective member on the color filter layer. The first anti-reflective member includes a first refractive layer having a first refractive index and a second refractive layer between the first refractive layer and the color filter layer and having a second refractive index different from the first refractive index. The second anti-reflective member includes a third refractive layer on the color filter layer and having a third refractive index, a fourth refractive layer on the third refractive layer and having a fourth refractive index different from the third refractive index, and a fifth refractive layer between the third refractive layer and the fourth refractive layer and having a fifth refractive index different from the third refractive index and the fourth refractive index.

According to the above, the display device according to embodiments of the present disclosure includes the anti-reflective member that has improved reflectance and strength and does not require a protective layer to protect the anti-reflective member. Thus, a stack structure of the display device is simplified, and a cost of manufacturing the display device is reduced.

BRIEF DESCRIPTION OF THE DRAWINGS

The above and other enhancements of the present disclosure will become readily apparent by reference to the following detailed description when considered in conjunction with the accompanying drawings, in which.

DETAILED DESCRIPTION

Figure 1:
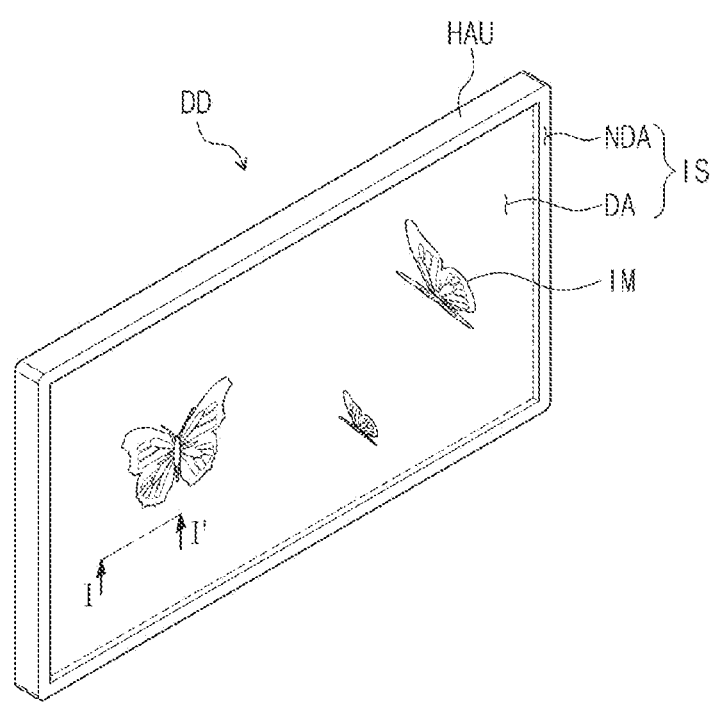
FIG. 1 is a perspective view showing a display device according to an embodiment of the present disclosure.

The present disclosure may be variously modified and realized in many different forms, and thus specific embodiments will be presented as examples in the drawings and described in more detail hereinbelow. However, the present disclosure should not be limited to the specific disclosed forms, and should be construed to include all modifications, equivalents, or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

In the drawings, like reference numerals refer to like elements throughout. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes," "including," "comprise," and/or "comprising," when used in this specification, specify the presence of stated features, integers, steps, operations, elements, components, and/or groups, but do not preclude the presence or addition of one or more other features, integers, steps, operations, elements, components, and/or groups thereof.

Hereinafter, a display device according to an embodiment will be explained in more detail with reference to the accompanying drawings.

Figure 2:
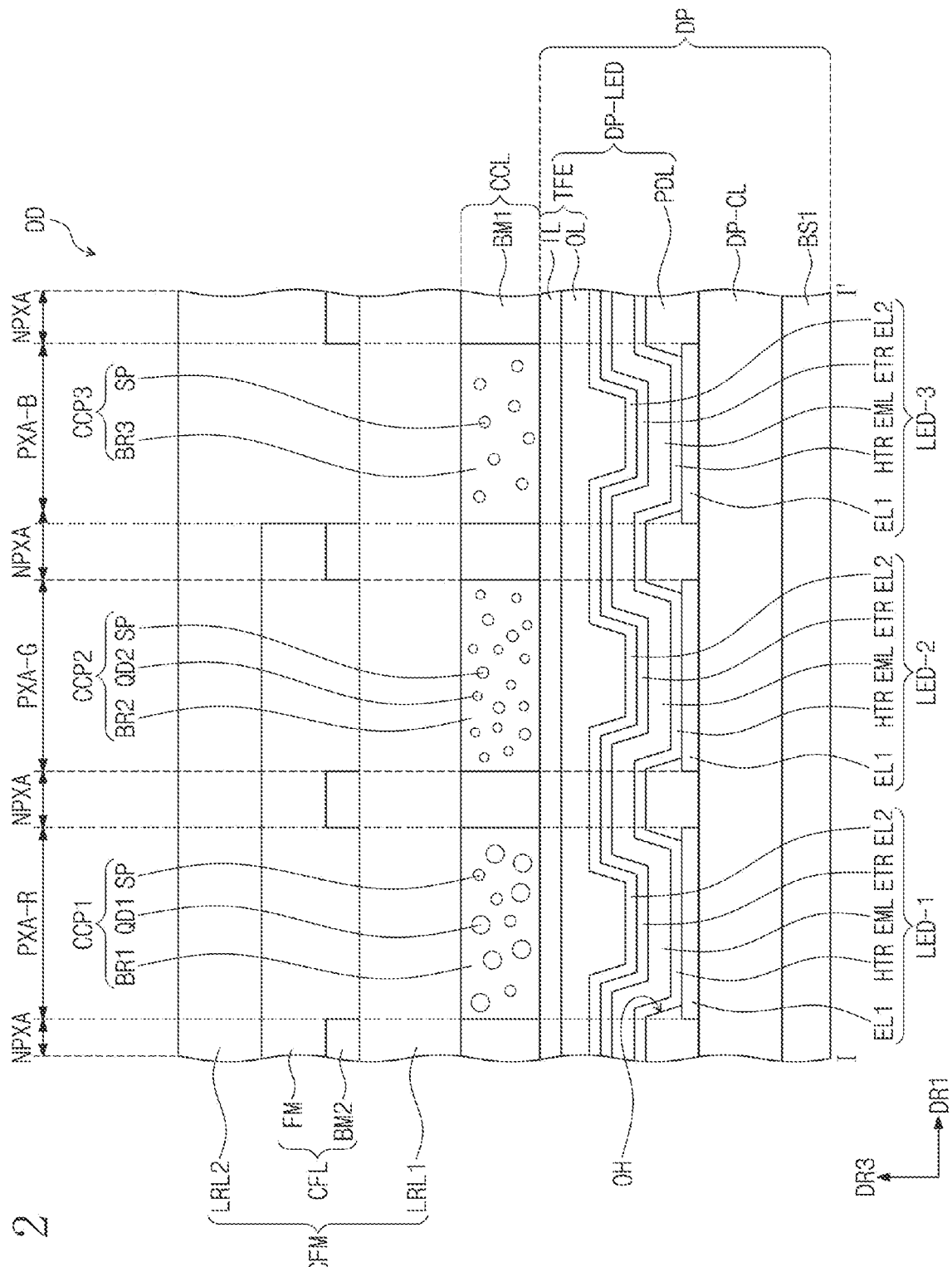
FIG. 2 is a cross-sectional view showing a display device according to an embodiment of the present disclosure.

FIG. 1 is a perspective view showing a display device DD according to an embodiment of the present disclosure, and FIG. 2 is a cross-sectional view showing the display device DD according to an embodiment of the present disclosure. FIG. 2 is a cross-sectional view taken along the line I-I' of FIG. 1.

Referring to FIGS. 1 and 2, the display device DD may be applied to a large-sized electronic item, such as a television set, a monitor, and/or an outdoor billboard. However, this is merely presented as an example. The display device DD may be applied to other electronic items as long as they do not depart from the concept of the present disclosure.

The display device DD may include a display surface IS corresponding to a display area DA and a non-display area NDA. The display device DD may include the display area DA through which an image IM is displayed and the non-display area NDA disposed adjacent to the display area DA. The display area DA through which the image IM is displayed may be substantially parallel to a plane defined by a first directional axis DR1 and a second directional axis DR2 crossing the first directional axis DR1. The image IM may not be displayed through the non-display area NDA. According to an embodiment, the non-display area NDA may be omitted from (e.g., may not be included in) the display device DD.

According to an embodiment, the display device DD may include a base layer BS1, a circuit layer DP-CL, a light emitting element layer DP-LED, a light control layer CCL, and a light control member CFM, which are sequentially stacked (e.g., in the stated order from the base layer BS1).

The base layer BS1 may be a member providing a base surface on which the light emitting element layer DP-LED is disposed. The base layer BS1 may be a glass substrate, a metal substrate, or a plastic substrate. However, the present disclosure is not limited thereto or thereby. According to an embodiment, the base layer BS1 may be an inorganic layer, an organic layer, or a composite material layer (e.g., an organic-inorganic composite material layer).

According to an embodiment, the circuit layer DP-CL may be disposed on the base layer BS1 and may include a plurality of transistors. Each of the transistors may include a control electrode, an input electrode, and an output electrode. As an example, the circuit layer DP-CL may include a switching transistor and a driving transistor to drive light emitting elements LED-1, LED-2, and LED-3 of the light emitting element layer DP-LED.

Each of the light emitting elements LED-1, LED-2, and LED-3 may include a first electrode EL1, a hole transport region HTR, a light emitting layer EML, an electron transport region ETR, and a second electrode EL2.

The light emitting layer EML of the light emitting elements LED-1, LED-2, and LED-3 may be disposed in an opening OH defined in a pixel definition layer PDL, and the hole transport region HTR, the electron transport region ETR, and the second electrode EL2 may be commonly disposed over the light emitting elements LED-1, LED-2, and LED-3. However, the present disclosure is not limited thereto or thereby. Different from the structure shown in FIG. 2, according to an embodiment, the hole transport region HTR, the light emitting layer EML, and the electron transport region ETR may be disposed in the opening OH of the pixel definition layer PDL after being patterned. As an example, the hole transport region HTR, the light emitting layer EML, and the electron transport region ETR of the light emitting elements LED-1, LED-2, and LED-3 may be patterned by an inkjet printing method.

In one or more embodiments, the light emitting elements LED-1, LED-2, and LED-3 may each include the first electrode EL1, the second electrode EL2, and a plurality of light emitting structures sequentially stacked in a thickness direction between the first electrode EL1 and the second electrode EL2. That is, the light emitting elements LED-1, LED-2, and LED-3 included in the display device DD may have a tandem structure including a plurality of light emitting layers.

An encapsulation layer TFE may cover the light emitting elements LED-1, LED-2, and LED-3. The encapsulation layer TFE may encapsulate the display element layer DP-LED. The encapsulation layer TFE may be a thin film encapsulation layer. The encapsulation layer TFE may have a single-layer structure or a multi-layer structure in which a plurality of layers are stacked. FIG. 2 shows the encapsulation layer TFE that includes one organic layer OL and one inorganic layer IL. However, the present disclosure is not limited thereto or thereby. According to an embodiment, the encapsulation layer TFE may have a structure in which an organic layer and an inorganic layer are repeatedly alternately stacked one on another. As an example, the encapsulation layer TFE may have a structure in which an inorganic layer, an organic layer, and an inorganic layer are sequentially stacked. The encapsulation layer TFE may be disposed on the second electrode EL2 and may fill in the opening OH.

The display device DD may include a non-light-emitting area NPXA and light emitting areas PXA-R, PXA-G, and PXA-B. The light emitting areas PXA-R, PXA-G, and PXA-B may be areas from which lights generated by the light emitting elements LED-1, LED-2, and LED-3 are emitted, respectively. The light emitting areas PXA-R, PXA-G, and PXA-B may be spaced apart from each other when viewed in a plane (e.g., in a plan view).

Each of the light emitting areas PXA-R, PXA-G, PXA-B may be defined by the pixel definition layer PDL. The non-light-emitting area NPXA may be an area defined between the light emitting areas PXA-R, PXA-G, and PXA-B adjacent to each other and may correspond to the pixel definition layer PDL. Meanwhile, each of the light emitting areas PXA-R, PXA-G, and PXA-B may correspond to a pixel. The pixel definition layer PDL may distinguish the light emitting elements LED-1, LED-2, and LED-3 from each other. The light emitting layer of the light emitting elements LED-1, LED-2, and LED-3 may be disposed in the openings OH defined through the pixel definition layer PDL.

The light emitting areas PXA-R, PXA-G, and PXA-B may be grouped into a plurality of groups according to colors of the lights generated by the light emitting elements LED-1, LED-2, and LED-3. The display device DD shown in FIGS. 1 and 2 may include first, second, and third light emitting areas PXA-R, PXA-G, and PXA-B respectively emitting red, green, and blue lights. As an example, the display device DD may include the first light emitting area PXA-R, the second light emitting area PXA-G, and the third light emitting area PXA-B, which are distinguished (e.g., separated) from each other.

The first light emitting area PXA-R, the second light emitting area PXA-G, and the third light emitting area PXA-B of the display device DD may correspond to the first light emitting element LED-1, the second light emitting element LED-2, and the third light emitting element LED-3, respectively. The first, second, and third light emitting elements LED-1, LED-2, and LED-3 may emit lights having the same wavelength range as each other. As an example, the first, second, and third light emitting elements LED-1, LED-2, and LED-3 may all emit blue light.

The light control layer CCL may be disposed on the light emitting element layer DP-LED. The light control layer CCL may include a plurality of light control portions (e.g., light control units) CCP1, CCP2, and CCP3. The light control portions CCP1, CCP2, and CCP3 may be spaced apart from each other. A light blocking portion (e.g., light blocking unit) BM1 may be disposed between the light control portions CCP1, CCP2, and CCP3 spaced apart from each other. However, the present disclosure is not limited thereto or thereby. In FIG. 2, the light blocking portion BM1 is shown to not overlap the light control portions CCP1, CCP2, and CCP3, however, in some embodiments, edges of the light control portions CCP1, CCP2, and CCP3 may overlap at least a portion of the light blocking portion BM1.

The light control layer CCL may include a first light control portion CCP1 including a first quantum dot QD1 that converts a first color light provided from a light emitting elements LED-1, LED-2, and/or LED-3 to a second color light, a second light control portion CCP2 including a second quantum dot QD2 that converts the first color light to a third color light, and a third light control portion CCP3 that transmits the first color light.

A core of the quantum dots QD1 and QD2 may be selected from a Group II-VI compound, a Group III-V compound, a Group III-VI compound, a Group compound, a Group IV-VI compound, a Group IV element, a Group IV compound, and a combination thereof.

The Group II-VI compound may be selected from a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

The Group I-III-VI compound may include a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof, and/or a quaternary compound such as $AgInGsS_2$, $CuInGaS_2$, and/or the like.

The Group III-V compound may be selected from a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal. For instance, InZnP may be selected as a group III-II-V compound.

The Group IV-VI compound may be selected from a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

In one or more embodiments, the binary compound, the ternary compound, and/or the quaternary compound may exist in particles at a uniform (e.g., substantially uniform) concentration or may exist in the same particle after being divided into plural portions having different concentrations (e.g., may exist in the same particle in a partially different concentration distribution). In addition, each quantum dot may have a core-shell structure that includes a core and a shell around (e.g., surrounding) the core. An interface between the core and the shell may have a concentration gradient in which the concentration of elements existing in the shell is lowered as the distance from a center of the quantum dot decreases.

In some embodiments, each quantum dot may have a core-shell structure that includes the core having the abovementioned nanocrystal and the shell around (e.g., surrounding) the core. The shell of the quantum dot may serve as a protective layer to prevent or reduce chemical modification of the core and to maintain semiconductor properties and/or as a charging layer to impart electrophoretic properties to the quantum dot. The shell may have a single-layer or multi-layer structure. An interface between the core and the shell may have a concentration gradient in which the concentration of elements existing in the shell is lowered as the distance from a center of the quantum dot decreases. Non-limiting examples of the shell of the quantum dot may include a metal oxide or a non-metal oxide, a semiconductor compound, or combinations thereof.

As an example, the metal oxide or non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound, such as $MgAl2O_4$, $CoFe_2O_4$, $NiFe_2O_4$, and/or $CoMn_2O_4$. However, the present disclosure is not limited thereto or thereby.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb. However, the present disclosure is not limited thereto or thereby.

In addition, the shape of the quantum dots should not be particularly limited as long as it is commonly utilized in the related art. For example, the quantum dots may have the shape of spherical, pyramidal, multi-arm, and/or cubic nanoparticles, nanotubes, nanowires, nanofibers, nanoplatelets, and/or the like.

The quantum dots may control the color of the light emitted therefrom according to a size of the particles, and thus, the quantum dots may have a variety of light emitting colors such as a blue color, a red color, a green color, and/or the like. According to an embodiment, the first light control portion CCP1 may provide the red light as the second color light, and the second light control portion CCP2 may provide the green light as the third color light. The third light control portion CCP3 may transmit the blue light (that is the first color light) provided from the light emitting elements LED-1, LED-2, and LED-3. As an example, the first quantum dot QD1 may be a red quantum dot, and the second quantum dot QD2 may be a green quantum dot. Details on the quantum dots described earlier may be applied to the quantum dots QD1 and QD2.

In addition, the light control layer CCL may include a scatterer SP. The first light control portion CCP1 may include the first quantum dot (e.g., a plurality of the first quantum dots) QD1 and the scatterer SP, the second light control portion CCP2 may include the second quantum dot (e.g., a plurality of the second quantum dots) QD2 and the scatterer SP, and the third light control portion CCP3 may include the scatterer SP without including any quantum dots.

The scatterer SP may be an inorganic particle. As an example, the scatterer SP may include at least one of $TiO_2$, ZnO, $Al_2O_3$, $SiO_2$, and a hollow silica particle. The scatterer SP may include at least one of $TiO_2$, ZnO, $Al_2O_3$, $SiO_2$, and the hollow silica particle, or may include a mixture of two or more of $TiO_2$, ZnO, $Al_2O_3$, $SiO_2$, and the hollow silica particle.

The first light control portion CCP1, the second light control portion CCP2, and the third light control portion CCP3 may respectively include base resins BR1, BR2, and BR3 in which the quantum dots QD1 and QD2 and the scatterer SP are dispersed. According to an embodiment, the first light control portion CCP1 may include the first quantum dot QD1 and the scatterer SP, which are dispersed in a first base resin BR1, the second light control portion CCP2 may include the second quantum dot QD2 and the scatterer SP, which are dispersed in a second base resin BR2, and the third light control portion CCP3 may include the scatterer SP dispersed in a third base resin BR3. The base resins BR1, BR2, and BR3 may be a medium in which the quantum dots QD1 and QD2 and the scatterer SP are dispersed and may include various suitable resin compositions that are generally referred to as a binder. As an example, the base resins BR1, BR2, and BR3 may be an acrylic-based resin, a urethane-based resin, a silicone-based resin, and/or an epoxy-based resin. The base resins BR1, BR2, and BR3 may be a transparent resin. According to an embodiment, the first base resin BR1, the second base resin BR2, and the third base resin BR3 may be the same as each other or different from each other.

The light control member (e.g., light control unit) CFM may be disposed on the light control layer CCL. The light control member CFM may include a first anti-reflective member (e.g., a first anti-reflective unit) LRL1, a color filter layer CFL, and a second anti-reflective member (a second anti-reflective unit) LRL2.

The first anti-reflective member LRL1 may be disposed on the light control layer CCL. As an example, the first anti-reflective member LRL1 may be disposed directly on the light control layer CCL. The first anti-reflective member LRL1 may totally reflect a portion of the blue light emitted from the light control layer CCL in a direction toward the color filter layer CFL to allow the portion of the blue light to be re-incident to the light control layer CCL. As an example, the portion of the blue light reflected by the first anti-reflective member LRL1 may be re-incident to the first light control portion CCP1 and the second light control portion CCP2 included in the light control layer CCL. The blue light re-incident to the light control layer CCL may be converted to the red light after passing through the first light control portion CCP1 or converted to the green light after passing through the second light control portion CCP2. A light efficiency of the display device DD may be improved through the light recirculation. That is, the light efficiency of the display device DD may be improved through reflecting blue light back to the first light control portion CCP1 and the second light control portion CCP2 by the first anti-reflective member LRL1 and then converting the re-incident blue light to red light and green light respectively.

The second anti-reflective member LRL2 may be disposed as an outermost layer of the light control member CFM. The second anti-reflective member LRL2 may reflect a light incident to the light control layer CCL from the outside back to the outside again. That is, the second anti-reflective member LRL2 may block the light incident to the light control layer CCL from the outside (e.g., from entering the display Device DD).

The color filter layer CFL may be disposed between the first anti-reflective member LRL1 and the second anti-reflective member LRL2. The color filter layer CFL may include a filter light blocking portion (e.g., a filter light blocking unit) BM2 and a color filter portion (e.g., a color filter) FM covering the filter light blocking portion BM2. The color filter portion FM may overlap the first light emitting area PXA-R and the second light emitting area PXA-G and may not overlap the third light emitting area PXA-B.

The color filter portion FM may be provided as a single layer. The color filter portion FM may cover the filter light blocking portion BM2 in a portion adjacent to the first light emitting area PXA-R and the second light emitting area PXA-G. Because the color filter portion FM is provided as a single layer, the color filter portion FM may be formed through more simplified processes compared with when the color filter portion FM includes filter layers provided to respectively correspond to the first, second, and third light emitting areas PXA-R, PXA-G, and PXA-B. As an example, according to an embodiment, because the color filter portion FM is provided as a single layer, the number of photolithography processes may be reduced when compared with the case of providing the color filter layers to respectively correspond to the first, second, and third light emitting areas PXA-R, PXA-G, and PXA-B.

The color filter portion FM may be a yellow filter portion (e.g., a yellow filter). As an example, the color filter portion FM may transmit the red light and the green light and may block the blue light. The color filter portion FM may have a refractive index equal to or greater than about 1.4 and equal to or smaller than about 1.7 and a thickness TFM equal to or greater than about 100 nm and equal to or smaller than about 2600 nm. In a case where the refractive index of the color filter portion FM is smaller than about 1.4 and the thickness of the color filter portion FM is smaller than about 100 nm, the color filter portion FM may not (e.g., may not be suitable to) perform an optical filter function, and in a case where the refractive index of the color filter portion FM is greater than about 1.7 and the thickness of the color filter portion FM is greater than about 2600 nm, all (or nearly all) lights may be blocked by the color filter portion FM.

When viewed in a plane (e.g., in a plan view), an edge of the light blocking portion BM1 may overlap an edge of the filter light blocking portion BM2. The edge of the light blocking portion BM1 may overlap the edge of the filter light blocking portion BM2 in a direction in which a third directional axis DR3 extends. The light blocking portion BM1 and the filter light blocking portion BM2 may include an organic light blocking material and/or an inorganic light blocking material, which includes a black pigment and/or dye. In addition, according to an embodiment, the light blocking portion BM1 and the filter light blocking portion BM2 may include an organic light blocking material and/or an inorganic light blocking material, which includes a blue pigment and/or dye. As an example, the light blocking portion BM1 may include the light blocking material including the black pigment and/or dye, and the filter light blocking portion BM2 may include the light blocking material including the blue pigment and/or dye. However, the present disclosure should not be limited thereto or thereby. According to an embodiment, the filter light blocking portion BM2 may be omitted.

According to an embodiment, the display device DD may further include a base substrate disposed on the light emitting element layer DP-LED. That is, according to an embodiment, the display device DD may further include the base substrate disposed between the display element layer DP-LED and light control layer CCL.

According to an embodiment, the display device DD may further include a base substrate disposed on the light control member CFM. As an example, the display device DD may further include the base substrate disposed on a fourth refractive layer OL3 (see FIG. 4).

Figure 3:
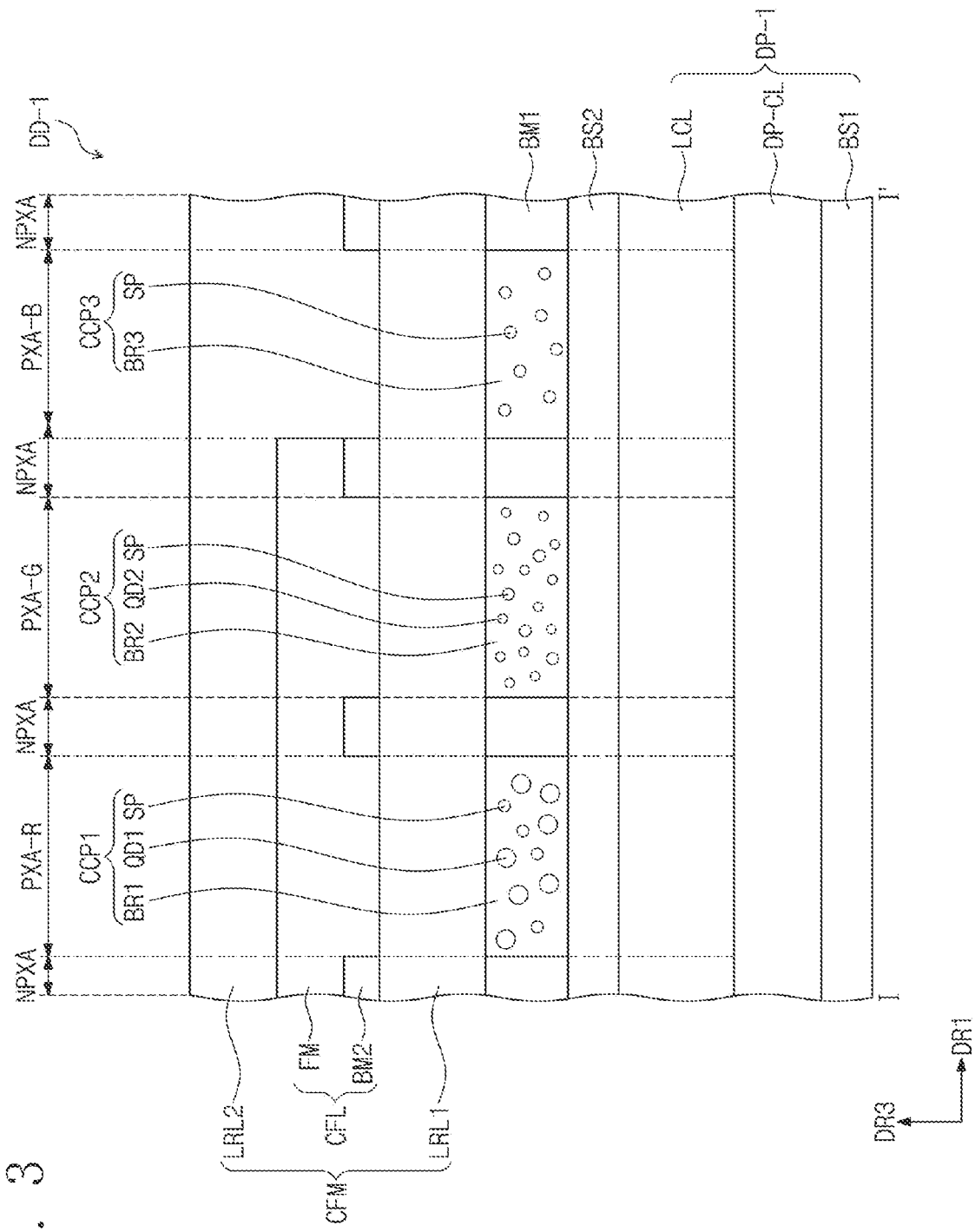
FIG. 3 is a cross-sectional view showing a display device according to an embodiment of the present disclosure.

FIG. 3 is a cross-sectional view showing a display device DD-1 according to an embodiment of the present disclosure. FIG. 3 is a cross-sectional view taken along the line I-I' of FIG. 1. Different from the display device DD shown in FIG. 2, the display device DD-1 shown in FIG. 3 includes a liquid crystal layer LCL instead of the light emitting element layer DP-LED (refer to FIG. 2).

According to an embodiment, the display device DD-1 may include a base layer BS1, a base substrate BS2 facing the base layer BS1, and the liquid crystal layer LCL disposed between the base layer BS1 and the base substrate BS2. That is, a display panel DP-1 may be a liquid crystal display device including the base layer BS1, the base substrate BS2 facing the base layer BS1, and the liquid crystal layer LCL disposed between the base layer BS1 and the base substrate BS2. In some embodiments, the liquid crystal layer LCL may include a backlight unit that emits a light to the light control member CFM.

Figure 4:
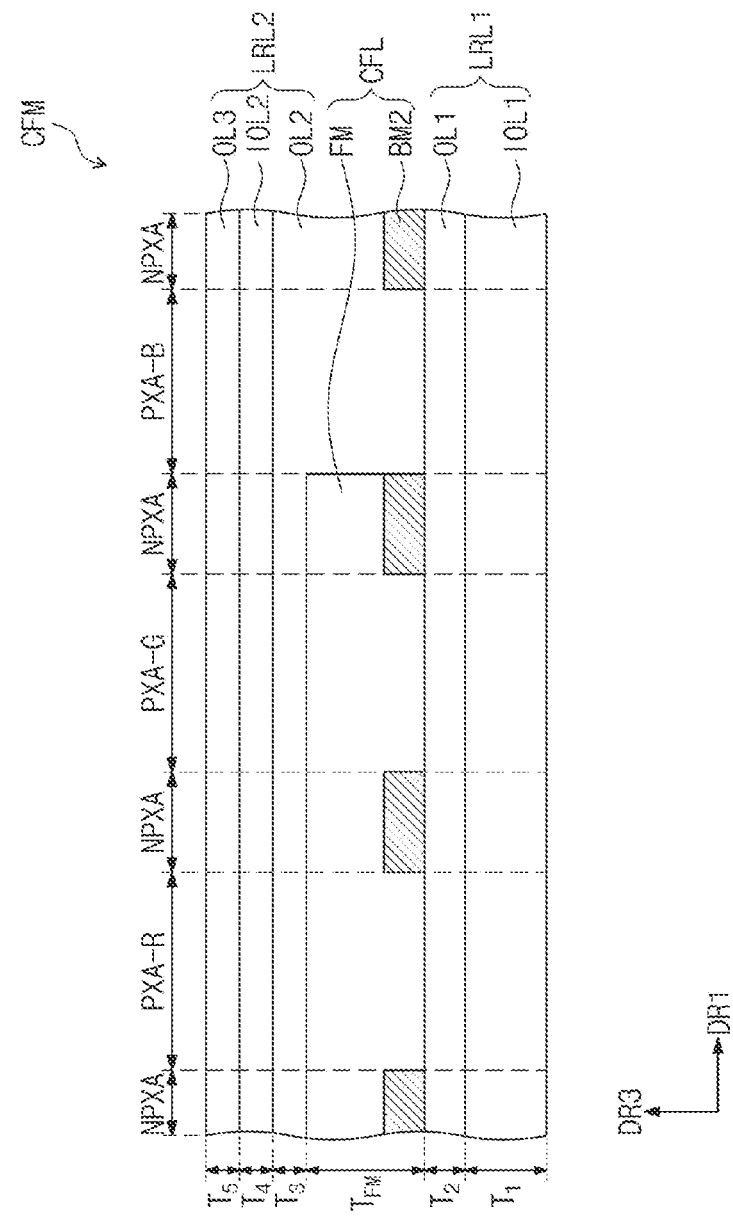
FIG. 4 is a cross-sectional view showing a portion of a display device according to an embodiment of the present disclosure.

FIG. 4 is a cross-sectional view showing a portion of the display device according to an embodiment of the present disclosure. FIG. 4 is a cross-sectional view showing the light control member CFM.

Referring to FIG. 4, the first anti-reflective member LRL1 may include a first refractive layer IOL1 and a second refractive layer OL1 disposed between the first refractive layer IOL1 and the color filter layer CFL. The first refractive layer IOL1 may have a first refractive index, and the second refractive layer OL1 may have a second refractive index smaller than the first refractive index. A total reflection ratio of the light incident to the first anti-reflective member LRL1 may increase when the second refractive index is smaller than the first refractive index compared with the total reflection ratio when the second refractive index is greater than the first refractive index.

The second refractive layer OL1 may have a pencil hardness equal to or greater than about 3H and equal to or smaller than about 5H. As the second refractive layer OL1 has the pencil hardness equal to or greater than about 3H and equal to or smaller than about 5H, the first anti-reflective member LRL1 may have an impact resistance even though a separate protective layer is not provided on the first anti-reflective member LRL1 to protect the first anti-reflective member LRL1.

A ratio of the first refractive index to the second refractive index may be 1.06:1.00 to 1.70:1.00. A difference between the first refractive index and the second refractive index may be in a range equal to or greater than about 0.1 and equal to or smaller than about 0.9. The first refractive index may be equal to or greater than about 1.60 and equal to or smaller than about 2.20, the second refractive index may be equal to or greater than about 1.30 and equal to or smaller than about 1.50, and each thickness $T_1$ and $T_2$ of the first refractive layer IOL1 and the second refractive layer OL1 may be equal to or greater than about 100 nm and equal to or smaller than about 400 nm.

The second anti-reflective member LRL2 may include a third refractive layer OL2, the fourth refractive layer OL3 disposed on the third refractive layer OL2, and a fifth refractive layer IOL2 disposed between the third refractive layer OL2 and the fourth refractive layer OL3. The second anti-reflective member LRL2 may have a structure in which the third refractive layer OL2, the fifth refractive layer IOL2, and the fourth refractive layer OL3 are sequentially stacked. The second anti-reflective member LRL2 may be provided in a stacked structure rather than a form of a low-reflective film. As a result, processes for the second anti-reflective member LRL2 may be simplified when compared with the second anti-reflective member LRL2 provided as the low-reflective film. As an example, the color filter layer CFL and the second anti-reflective member LRL2 may be formed through successive processes.

The third refractive layer OL2 may have a third refractive index, the fourth refractive layer OL3 may have a fourth refractive index smaller than (or equal to) the third refractive index, and the fifth refractive layer IOL2 may have a fifth refractive index greater than each of the third refractive index and the fourth refractive index. A ratio of the third refractive index to the fourth refractive index may be 1.07:1.00 to 1.00:1.00, a ratio of the fourth refractive index to the fifth refractive index may be 1.00:1.20 to 1.00:1.60, and a ratio of the third refractive index to the fifth refractive index may be 1.00:1.20 to 1.00:1.60. A difference between the third refractive index and the fourth refractive index may be equal to or greater than about 0 and equal to or smaller than about 0.11, a difference between the fourth refractive index and the fifth refractive index may be equal to or greater than about 0.51 and equal to or smaller than about 0.70, and a difference between the third refractive index and the fifth refractive index may be equal to or greater than about 0.51 and equal to or smaller than about 0.70. Each of the third refractive index and the fourth refractive index may be equal to or greater than about 1.39 and equal to or smaller than about 1.50, the fifth refractive index may be equal to or greater than about 1.9 and equal to or smaller than about 2.2, each of a thickness $T_3$ of the third refractive layer OL2 and a thickness $T_4$ of the fifth refractive layer IOL2 may be equal to or greater than about 100 nm and equal to or smaller than about 400 nm, and a thickness $T_5$ of the fourth refractive layer OL3 may be equal to or greater than about 75 nm and equal to or smaller than about 85 nm.

The second refractive layer OL1, the third refractive layer OL2, and the fourth refractive layer OL3 may (e.g., each) include a polymer resin including at least one repeating unit represented by any one of the following Chemical Formulae 1, 2, and 3.

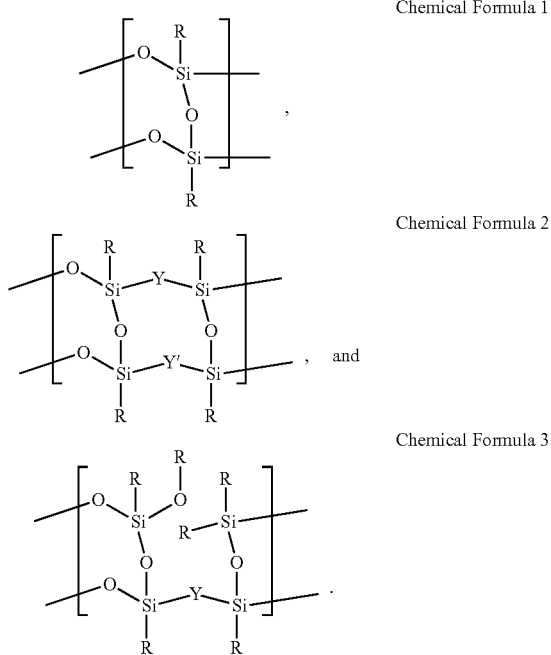

In Chemical Formulae 1 to 3, Y and Y' are each independently O, NRa, or $(SiO_{3/2}R)_{4+2n}O$, R and Ra are each independently a hydrogen atom, a deuterium atom, a halogen atom, a substituted or unsubstituted silyl group, a substituted or unsubstituted thio (e.g., thiol) group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and n is an integer of 1 to 20. The polymer resin may include a repeating unit containing silicone, and thus, the strength of the polymer resin may be improved.

According to an embodiment, in Chemical Formulae 1 to 3, R may be a hydrogen atom, a deuterium atom, a halogen atom, a substituted or unsubstituted amine group, a substituted or unsubstituted oxy group, a substituted or unsubstituted acrylic group, a substituted or unsubstituted methacrylic group, a substituted or unsubstituted thio group, a substituted or unsubstituted isocyanate group, a nitrile group, a nitro group, a substituted or unsubstituted phenyl group, a substituted or unsubstituted alkyl group having 1 to 12 carbon atoms, a substituted or unsubstituted alkenyl group having 2 to 12 carbon atoms, a substituted or unsubstituted cycloalkyl group having 3 to 12 ring-forming carbon atoms, a substituted or unsubstituted heterocycloalkyl group having 1 to 12 ring-forming carbon atoms, a substituted or unsubstituted aryl group having 6 to 12 ring-forming carbon atoms, or a substituted or unsubstituted heteroaryl group having 2 to 12 ring-forming carbon atoms. According to an embodiment, in Chemical Formulae 1 to 3, R may be an alkyl group having 1 to 10 carbon atoms, where at least one fluorine atom is substituted. That is, in chemical formulae 1 to 3, R may be an alkyl group having 1 to 10 carbon atoms and substituted with at least one fluorine atom. As the hydrogen atom of the alkyl group is substituted with a fluorine atom, the polymer resin may have a low refractive property.

According to an embodiment, the polymer resin may further include a filler having a hollow structure. The filler may include at least one of a hollow silica, an acrylic-based polymer, a vinyl-based polymer, and an epoxy-based polymer. The hollow structure may refer to a structure in which its interior is hollow (e.g., with an empty interior). For example, the hollow structure may be a spherical shape containing air therein or a cylindrical shape containing air therein. As the polymer resin includes the filler with the air-containing hollow structure, each of the second refractive layer OL1, the third refractive layer OL2, and the fourth refractive layer OL3 may have a low-reflective property.

According to an embodiment, the polymer resin may include more than 0 wt % and less than 50 wt % of the filler based on a total weight of the polymer resin. In a case where the polymer resin includes more than 50 wt % of the filler, the refractive index becomes excessively low, and thus, the polymer resin may not perform the function as the refractive layer.

The first refractive layer IOL1 and the fifth refractive layer IOL2 may each independently include silicon nitride and/or silicon oxynitride. As an example, the first refractive layer IOL1 and the fifth refractive layer IOL2 may respectively include silicon nitride and silicon oxynitride, or both the first refractive layer IOL1 and the fifth refractive layer IOL2 may include silicon nitride. When the first refractive layer IOL1 and the fifth refractive layer IOL2 both include silicon nitride, the refractive index may be greater than that (e.g., the refractive index) when the first refractive layer IOL1 and the fifth refractive layer IOL2 both include silicon oxynitride.

Figure 5:
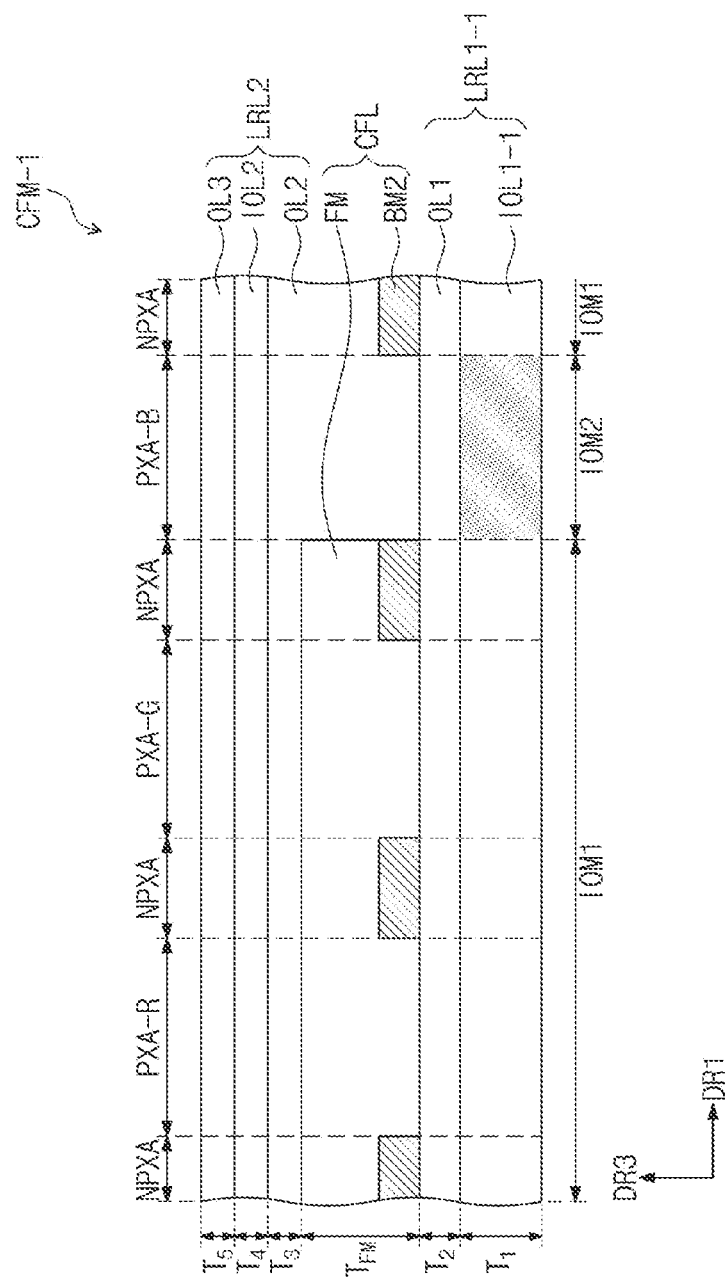
FIG. 5 is a cross-sectional view showing a portion of a display device according to an embodiment of the present disclosure.

FIG. 5 is a cross-sectional view showing a portion of a display device according to an embodiment of the present disclosure. FIG. 5 is a cross-sectional view showing a light control member CFM-1 according to an embodiment. In FIG. 5, different features from those shown in FIGS. 1 to 4 will be mainly described, and the same descriptions as those in FIGS. 1 to 4 will be omitted.

Different from the light control member CFM shown in FIG. 4, the light control member CFM-1 shown in FIG. 5 may include a first refractive layer IOL1-1 including a first portion IOM1 that has a first refractive index and does not overlap a third light emitting area PXA-B and a second portion IOM2 that has a refractive index smaller than the first refractive index.

Referring to FIG. 5, the first refractive layer IOL1-1 may include the first portion IOM1 that has the first refractive index and does not overlap the third light emitting area PXA-B and the second portion IOM2 that has the refractive index smaller than the first refractive index (and overlaps the third light emitting area PXA-B). The first portion IOM1 may include silicon nitride, and the second portion IOM2 may include silicon oxynitride. The refractive index of the first portion IOM1 may be equal to or greater than about 1.9 and equal to or smaller than about 2.2. The refractive index of the second portion IOM2 may be equal to or greater than about 1.6 and equal to or smaller than about 1.8.

A transmission amount of a blue light in the first portion IOM1 may be different from a transmission amount of the blue light in the second portion IOM2. The transmission amount of the blue light in the second portion IOM2 may be greater than the transmission amount of the blue light in the first portion IOM1. As a result, an incident amount of the blue light incident to the color filter layer CFL from the light emitting elements LED-1, LED-2, and LED-3 (refer to FIG. 2) may be greater in the third light emitting area PXA-B than in each of the first light emitting area PXA-R and the second light emitting area PXA-G.

Figure 6:
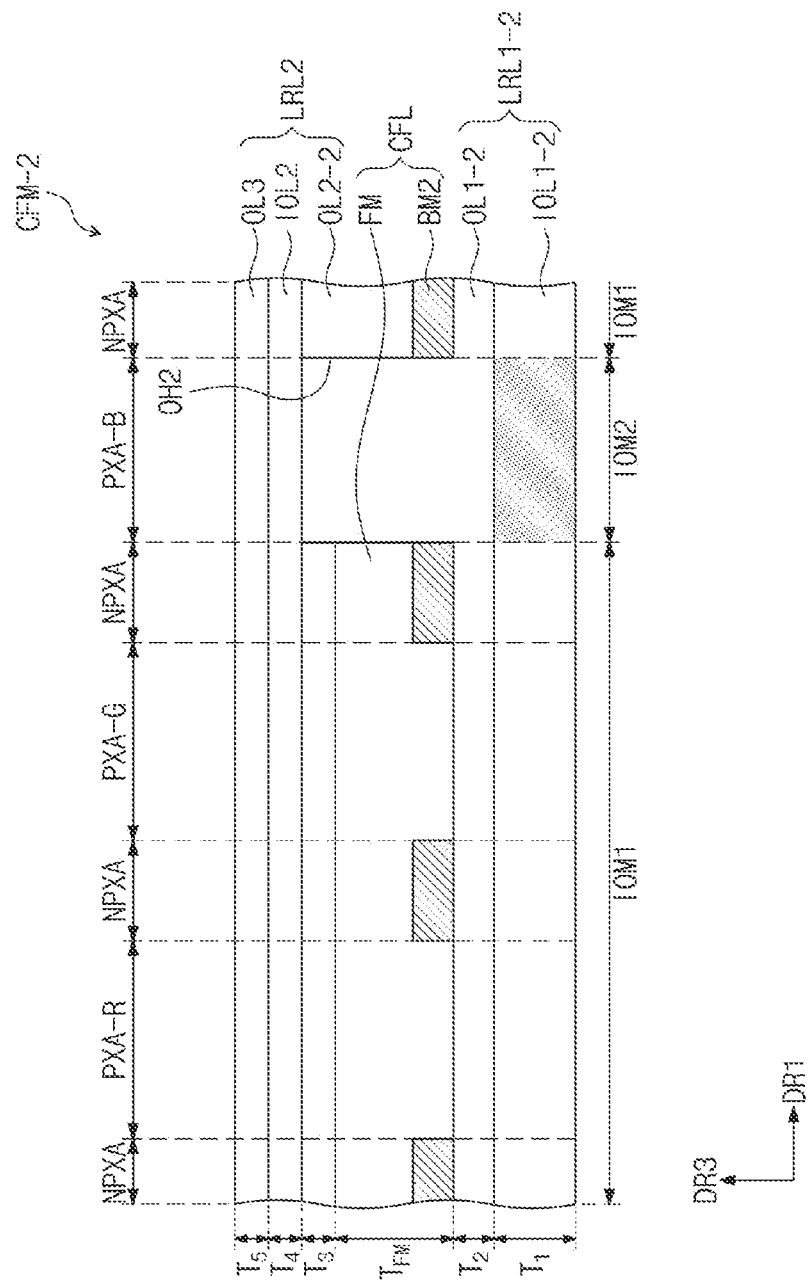
FIG. 6 is a cross-sectional view showing a portion of a display device according to an embodiment of the present disclosure.

FIG. 6 is a cross-sectional view showing a portion of a display device according to an embodiment of the present disclosure. FIG. 6 is a cross-sectional view showing a light control member CFM-2 according to an embodiment. In FIG. 6, different features from those shown in FIGS. 1 to 4 will be mainly described, and the same descriptions as those in FIGS. 1 to 4 will be omitted.

Different from the light control member CFM shown in FIG. 4, the light control member CFM-2 shown in FIG. 6 includes a third refractive layer OL2-2 provided with an opening OH2 defined through a portion thereof overlapping a third light emitting area PXA-B and a second refractive layer OL1-2 filled in the opening OH2.

Referring to FIG. 6, the light control member CFM-2 may include the third refractive layer OL2-2 provided with the opening OH2 defined through the portion thereof overlapping the third light emitting area PXA-B and the second refractive layer OL1-2 filled in the opening OH2. The number of refractive layers in the portion overlapping the third light emitting area PXA-B may be greater than that in portions overlapping the first light emitting area PXA-R and the second light emitting area PXA-G. Accordingly, an amount of the blue light transmitted to the color filter layer CFL from the light emitting elements LED-1, LED-2, and LED-3 may be greater in the third light emitting area PXA-B than in each of the first light emitting area PXA-R and the second light emitting area PXA-G.

Figure 7:
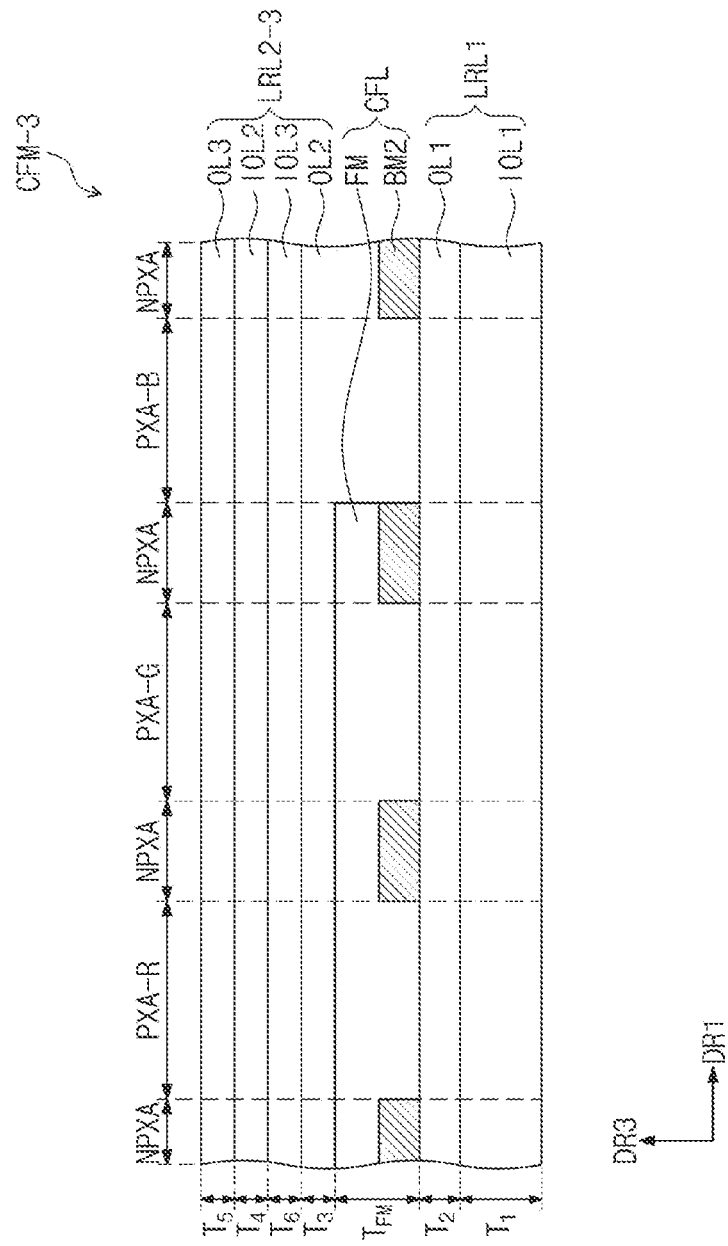
FIG. 7 is a cross-sectional view showing a portion of a display device according to an embodiment of the present disclosure.

FIG. 7 is a cross-sectional view showing a portion of a display device according to an embodiment of the present disclosure. FIG. 7 is a cross-sectional view showing a light control member CFM-3 according to an embodiment. In FIG. 7, different features from those in FIGS. 1 to 4 will be mainly described, and the same descriptions as those in FIGS. 1 to 4 will be omitted.

Different from the light control member CFM shown in FIG. 4, the light control member CFM-3 shown in FIG. 7 includes a second anti-reflective member LRL2-3 that further includes a sixth refractive layer IOL3 disposed between a third refractive layer OL2 and a fifth refractive layer IOL2.

Referring to FIG. 7, the light control member CFM-3 may further include the sixth refractive layer IOL3 disposed between the third refractive layer OL2 and the fifth refractive layer IOL2. The sixth refractive layer IOL3 may have a sixth refractive index greater than a third refractive index and smaller than a fifth refractive index. The sixth refractive index may be equal to or greater than about 1.6 and equal to or smaller than about 1.8. The sixth refractive layer IOL3 may have a thickness $T_6$ equal to or greater than about 100 nm and equal to or smaller than about 400 nm. The sixth refractive layer IOL3 may include silicon oxynitride.

Hereinafter, the display device according to an embodiment of the present disclosure will be described in more detail with reference to embodiment examples and comparative examples. In addition, the embodiment examples shown below are examples to aid understanding of the present disclosure, and the scope of the present disclosure should not be limited thereto or thereby.

MANUFACTURING OF THE DISPLAY DEVICE ACCORDING TO EMBODIMENT EXAMPLES

1. Manufacturing of the Display Device According to Embodiment Example 1

A first refractive layer including silicon nitride and having a refractive index of about 1.9 and a thickness of about 400 nm was formed. A second refractive layer having a refractive index of about 1.39 and a thickness of about 100 nm was formed on the first refractive layer. A color filter layer having a refractive index of about 1.6 and a thickness of about 2600 nm, overlapping a first light emitting area emitting a red light and a second light emitting area emitting a green light, and not overlapping a third light emitting area emitting a blue light was formed on the second refractive layer. A third refractive layer having a refractive index of about 1.5 and a thickness of about 5000 nm was formed on the color filter layer. A fifth refractive layer having a refractive index of about 1.9 and a thickness of about 120 nm was formed on the third refractive layer. A fourth refractive layer having a refractive index of about 1.39 and a thickness about 75 nm was formed on the fifth refractive layer, and thus, a light control member was manufactured. The display device was manufactured by forming a base layer, forming a display element layer on the base layer, forming a light control layer on the display element layer, and forming the above-described light control member on the light control layer.

2. Manufacturing of the Display Device According to Embodiment Example 2

The display device of embodiment example 2 was manufactured by the same method as that of embodiment example 1 except that a fourth refractive layer has a thickness of about 85 nm and a fifth refractive layer has a thickness of about 110 nm.

3. Manufacturing of the Display Device According to Embodiment Example 3

The display device of embodiment example 3 was manufactured by the same method as that of embodiment example 1 except that a fourth refractive layer has a thickness of about 85 nm.

4. Manufacturing of the Display Device According to Embodiment Example 4

The display device of embodiment example 4 was manufactured by the same method as that of embodiment example 1 except that a color filter layer has a thickness of about 100 nm and a second refractive layer has a thickness of about 100 nm.

5. Manufacturing of the Display Device According to Embodiment Example 5

The display device of embodiment example 5 was manufactured by the same method as that of embodiment example 1 except that a color filter layer has a thickness of about 600 nm and a second refractive layer has a thickness of about 100 nm.

6. Manufacturing of the Display Device According to Embodiment Example 6

The display device of embodiment example 6 was manufactured by the same method as that of embodiment example 1 except that a color filter layer has a thickness of about 2100 nm and a second refractive layer has a thickness of about 100 nm.

7. Manufacturing of the Display Device According to Embodiment Example 7

The display device of embodiment example 7 was manufactured by the same method as that of embodiment example 1 except that a first refractive layer has a thickness of about 300 nm and a second refractive layer has a thickness of about 600 nm in a portion overlapping a third light emitting area.

8. Manufacturing of the Display Device According to Embodiment Example 8

The display device of embodiment example 8 was manufactured by the same method as that of embodiment example 1 except that a color filter layer has a thickness of about 100 nm, a first refractive layer has a refractive index of about 1.6, and a second refractive layer has a thickness of about 100 nm.

9. Manufacturing of the Display Device According to Embodiment Example 9

The display device of embodiment example 9 was manufactured by the same method as that of embodiment example 1 except that a color filter layer has a thickness of about 600 nm and a first refractive layer has a refractive index of about 1.9 in a portion overlapping a first light emitting area and a second light emitting area and has a refractive index of about 1.6 in a portion overlapping a third light emitting area.

10. Manufacturing of the Display Device According to Embodiment Example 10

The display device of embodiment example 10 was manufactured by the same method as that of embodiment example 9 except that a first refractive layer has a thickness of about 200 nm in a portion overlapping a third light emitting area.

11. Manufacturing of a Display Device According to Embodiment Example

A first layer that includes silicon nitride, oxide, and oxynitride and has a thickness of about 400 nm was formed. A second layer that has a refractive index of about 1.25 and a thickness of about 1500 nm was formed on the first layer. A third layer that includes the same material as that of the first layer and has the same thickness as that of the first layer was formed on the second layer. A color filter layer that includes a plurality of color filter portions respectively overlapping a first light emitting area, a second light emitting area, and a third light emitting area and light blocking portions respectively disposed between the color filter portions was formed on the third layer. A fourth layer that has a refractive index of about 1.5 and a thickness of about 5000 nm was formed on the color filter layer. A film having a low-reflective function was attached on the fourth layer, and thus, a light control member according to the comparative example was manufactured. The display device of the comparative example was manufactured by forming a base layer, forming a display element layer on the base layer, forming a light control layer on the display element layer, and forming the light control member of the comparative example on the light control layer.

EVALUATION OF THE REFLECTANCE OF THE DISPLAY DEVICE

An SCI reflectance and a blue reflectance of embodiment examples 1 to 10 and the comparative example were evaluated. The SCI reflectance refers to a reflectance of the blue light toward the outside from among external lights incident to the display device from the outside, and the blue reflectance refers to a reflectance of the blue light, which is incident to the color filter layer from the light emitting element layer, toward the light emitting element layer. As the SCI reflectance decreases, an amount of the light reflected to the user decreases, and the display device has a suitable or superb visibility. As the blue reflectance increases, the light efficiency increases by the light recirculation, and the display device has a suitable or superb visibility.

Evaluation 1 of Physical Properties of the Display Device Including a Light Control Portion

TABLE 1

| | SCI reflectance (first and second light emitting areas) | SCI reflectance (third light emitting area) |
|---|---|---|
| Embodiment example 1 | 0.67% | 0.61% |
| Embodiment example 2 | 0.80% | 0.61% |
| Embodiment example 3 | 0.75% | 0.61% |
| Comparative example | 0.76% | 0.76% |

Referring to Table 1, embodiment examples 1 to 3 have the similar or better (or superior) SCI reflectance in the first and second light emitting areas compared with the comparative example. Embodiment examples 1 to 3 have better (or superior) SCI reflectance in the third light emitting area compared with the comparative example. Accordingly, although the low-reflective layer in the form of a film is not provided, the reflection of the external light may be reduced to the similar level or lower (or superior) level to that when the low-reflective layer is provided in the form of the film. Compared with the comparative example in which the low-reflective layer in the form of the film is provided, when the low-reflective layer is provided in the stacked structure as the embodiment examples, manufacturing processes for the display device may be simplified, and thus, a manufacturing cost may be reduced.

Evaluation 2 of Physical Properties of the Display Device Including a Light Control Portion

TABLE 2

|  | Blue reflectance (first and second light emitting areas) | Blue reflectance (third light emitting area) |
| --- | --- | --- |
| Embodiment example 4 | 5.77% | — |
| Embodiment example 5 | 5.93% | — |
| Embodiment example 6 | 5.85% | — |
| Embodiment example 7 | — | 4.91% |
| Embodiment example 8 | 3.49% | 2.35% |
| Embodiment example 9 | 5.93% | 2.35% |
| Embodiment example 10 | 5.93% | 1.40% |
| Comparative example | 3.87% | 3.87% |

Referring to Table 2, embodiment examples 4 to 10 have the similar or better (or superior) blue reflectance in the first and second light emitting areas compared with the comparative example. This is because the first refractive layer having the higher refractive index and the second refractive layer having the lower refractive index are sequentially stacked on the light control layer and the blue light transmitted through the light control layer is reflected back to the light control layer. Accordingly, compared with the comparative example including the low refractive layer that requires a separate protective layer, the blue reflectance of about the same level as the comparative example may be achieved in a case where a high-strength first anti-reflective member that does not require a separate protective layer is included. Accordingly, because the embodiment examples that do not include the protective layer have a simple stacked structure compared with the comparative example that includes the protective layer, the manufacturing processes for the display device may be simplified, and thus, the manufacturing cost may be reduced. In addition, it is observed that embodiment examples 8 to 10 have the blue reflectance lower than that of embodiment example 7 in the third light emitting area. Accordingly, it is observed that the blue reflectance in the third light emitting area is lower when the refractive index of the first refractive layer is about 1.6 than when the refractive index is about 1.9. The lower blue reflectance means that a ratio of the blue light reflected back to the light control layer to the blue light exiting from the light control layer is low, and this indicates that the transmittance of the blue light is high. That is, it is observed that the transmittance of the blue light is high in the third light emitting area.

When embodiment example 10 is compared with embodiment examples 8 and 9, the blue reflectance of embodiment example 10 in the third light emitting area is lower than that of embodiment examples 8 and 9. Accordingly, as the thickness of the first refractive layer decreases in the third light emitting area, the blue reflectance decreases, and thus, the transmittance of the blue light is high. That is, it is observed that the transmittance of the blue light in the third light emitting area increases as the refractive index of the first refractive layer decreases or the thickness of the first refractive layer decreases.

In addition, different from the comparative example, when the refractive index and the thickness of the first refractive layer in the first and second light emitting areas are set to be different from those of the first refractive layer in the third light emitting area, the blue reflectance may increase in the first and second light emitting areas, and the blue reflectance may decrease in the third light emitting area.

As the display device according to the embodiment includes the anti-reflective member that does not require a protective layer to protect the anti-reflective member and has improved reflectance and strength, the stacked structure thereof is simplified, and the manufacturing cost is reduced. In addition, the display device according to the embodiment may include the color filter layer having a single-layer structure, and thus, the manufacturing cost may be reduced compared with the color filter layer including a plural filter portions spaced apart from each other.

Expressions such as "at least one of" or "at least one selected from" when preceding a list of elements, modify the entire list of elements and do not modify the individual elements of the list. Further, the use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

Although the example embodiments of the present disclosure have been described, it is understood that the present disclosure should not be limited to these embodiments but various changes and modifications can be made by one ordinary skilled in the art within the spirit and scope of the present disclosure as hereinafter claimed, and equivalents thereof.

Therefore, the disclosed subject matter should not be limited to any single embodiment described herein, and the scope of the present disclosure shall be determined according to the attached claims, and equivalents thereof.

What is claimed is:

1. A display device comprising:
a light emitting element layer;
a light control layer on the light emitting element layer and comprising a quantum dot;
a first anti-reflective member on the light control layer;
a color filter layer on the first anti-reflective member and comprising a filter light blocking portion and a color filter portion; and
a second anti-reflective member on the color filter layer, wherein the first anti-reflective member comprises:
a first refractive layer having a first refractive index; and
a second refractive layer between the first refractive layer and the color filter layer and having a second refractive index smaller than the first refractive index, and
the second anti-reflective member comprises:
a third refractive layer on the color filter layer and having a third refractive index;
a fourth refractive layer on the third refractive layer and having a fourth refractive index equal to or smaller than the third refractive index; and
a fifth refractive layer between the third refractive layer and the fourth refractive layer and having a fifth refractive index greater than each of the third refractive index and the fourth refractive index.

2. The display device of claim 1, wherein
the display device comprises first, second, and third light emitting areas to respectively emit lights having different wavelengths from each other, and
the color filter portion overlaps the first and second light emitting areas and does not overlap the third light emitting area.

3. The display device of claim 2, wherein the color filter portion is a yellow filter portion.

4. The display device of claim 2, wherein
the color filter portion has a refractive index equal to or greater than about 1.4 and equal to or smaller than about 1.7, and
a portion of the color filter portion, which does not overlap the filter light blocking portion, has a thickness equal to or greater than about 100 nm and equal to or smaller than about 2600 nm.

5. The display device of claim 1, wherein a ratio of the first refractive index to the second refractive index is 1.06:1.00 to 1.70:1.00.

6. The display device of claim 1, wherein a difference between the first refractive index and the second refractive index is in a range equal to or greater than about 0.1 and equal to or smaller than about 0.9.

7. The display device of claim 1, wherein
the first refractive index is equal to or greater than about 1.60 and equal to or smaller than about 2.20,
the second refractive index is equal to or greater than about 1.30 and equal to or smaller than about 1.50, and
a thickness of each of the first refractive layer and the second refractive layer is equal to or greater than about 100 nm and equal to or smaller than about 400 nm.

8. The display device of claim 1, wherein
each of the first refractive layer and the fifth refractive layer comprises silicon nitride or silicon oxynitride,
each of the second refractive layer, the third refractive layer, and the fourth refractive layer comprises a polymer resin comprising at least one repeating unit represented by any one of the following Chemical Formulae 1, 2, or 3:

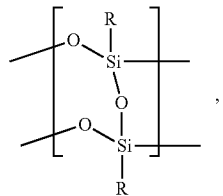

Chemical Formula 1

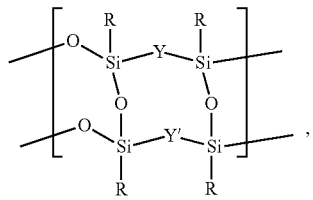

Chemical Formula 2

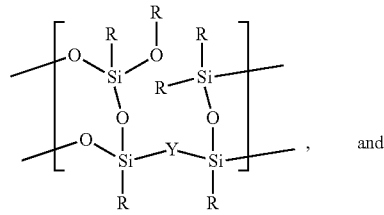

Chemical Formula 3 and wherein in Chemical Formulae 1 to 3, Y and Y' are each independently O, NRa, or $(SiO_{3/2}R)_{4+2n}O$, R and Ra are each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, and n is an integer of 1 to 20.

9. The display device of claim 8, wherein
the polymer resin further comprises a filler having a hollow structure, and
the filler comprises at least one selected from the group consisting of a hollow silica, an acrylic-based polymer, a vinyl-based polymer, and an epoxy-based polymer.

10. The display device of claim 9, wherein the polymer resin comprises more than 0 wt % and less than 50 wt % of the filler based on a total weight of the polymer resin.

11. The display device of claim 8, wherein in Chemical Formulae 1 to 3, R is an alkyl group having 1 to 10 carbon atoms and substituted with at least one fluorine atom.

12. The display device of claim 1, wherein
a ratio of the third refractive index to the fourth refractive index is 1.07:1.00 to 1.00:1.00,
a ratio of the fourth refractive index to the fifth refractive index is 1.00:1.20 to 1.00:1.60, and
a ratio of the third refractive index to the fifth refractive index is 1.00:1.20 to 1.00:1.60.

13. The display device of claim 1, wherein
a difference between the third refractive index and the fourth refractive index is equal to or greater than about 0 and equal to or smaller than about 0.11, and
each of a difference between the fourth refractive index and the fifth refractive index and a difference between the third refractive index and the fifth refractive index is equal to or greater than about 0.51 and equal to or smaller than about 0.70.

14. The display device of claim 1, wherein
each of the third refractive index and the fourth refractive index is equal to or greater than about 1.39 and equal to or smaller than about 1.50,
the fifth refractive index is equal to or greater than about 1.9 and equal to or smaller than about 2.2,
each of a thickness of the third refractive layer and a thickness of the fifth refractive layer is equal to or greater than about 100 nm and equal to or smaller than about 400 nm, and
a thickness of the fourth refractive layer is equal to or greater than about 75 nm and equal to or smaller than about 85 nm.

15. The display device of claim 1, wherein
the display device comprises first, second, and third light emitting areas to respectively emit lights having different wavelengths from each other, and
the first refractive layer comprises:
a first portion that does not overlap the third light emitting area and having the first refractive index; and
a second portion that overlaps the third light emitting area and having a refractive index smaller than the first refractive index.

16. The display device of claim 15, wherein the first portion comprises silicon nitride, and the second portion comprises silicon oxynitride.

17. The display device of claim 15, wherein
the third refractive layer has an opening defined therethrough to overlap the third light emitting area, and
the second refractive layer fills in the opening.

18. The display device of claim 1, wherein the second anti-reflective member further comprises a sixth refractive layer between the third refractive layer and the fifth refractive layer and having a sixth refractive index greater than the third refractive index and smaller than the fifth refractive index.

19. The display device of claim 18, wherein
the sixth refractive index is equal to or greater than about 1.6 and equal to or smaller than about 1.8, and
the sixth refractive layer has a thickness equal to or greater than about 100 nm and equal to or smaller than about 400 nm.

20. A display device comprising:
a light emitting element layer to emit a blue light;
a light control layer comprising a first light control portion to convert the blue light to a red light, a second light control portion to convert the blue light to a green light, and a third light control portion to transmit the blue light;
a first anti-reflective member on the light control layer;
a color filter layer on the first anti-reflective member and comprising a filter light blocking portion and a color filter portion; and
a second anti-reflective member on the color filter layer, wherein
the first anti-reflective member comprises:
a first refractive layer having a first refractive index; and
a second refractive layer between the first refractive layer and the color filter layer and having a second refractive index different from the first refractive index, and
the second anti-reflective member comprises:
a third refractive layer on the color filter layer and having a third refractive index;
a fourth refractive layer on the third refractive layer and having a fourth refractive index different from the third refractive index; and
a fifth refractive layer between the third refractive layer and the fourth refractive layer and having a fifth refractive index different from the third refractive index and the fourth refractive index.

* * * * *